United States Patent
Nishimura (10) Patent No.: US 9,819,328 B2
(45) Date of Patent: Nov. 14, 2017

(54) TUNING-FORK TYPE QUARTZ VIBRATOR

(71) Applicant: Murata Manufacturing Co., Ltd., Nagaokakyo-shi, Kyoto-fu (JP)

(72) Inventor: Toshio Nishimura, Nagaokakyo (JP)

(73) Assignee: MURATA MANUFACTURING CO., LTD., Nagaokakyo-Shi, Kyoto-Fu (JP)

(*) Notice: Subject to any disclaimer, the term of this patent is extended or adjusted under 35 U.S.C. 154(b) by 280 days.

(21) Appl. No.: 14/805,534

(22) Filed: Jul. 22, 2015

(65) Prior Publication Data

US 2015/0326201 A1    Nov. 12, 2015

Related U.S. Application Data

(63) Continuation of application No. PCT/JP2013/081625, filed on Nov. 25, 2013.

(30) Foreign Application Priority Data

Jan. 29, 2013    (JP) .................................. 2013-014725

(51) Int. Cl.
    *H03H 9/215*    (2006.01)
    *H01L 41/047*   (2006.01)
    *H03H 9/02*     (2006.01)

(52) U.S. Cl.
    CPC ........... *H03H 9/215* (2013.01); *H01L 41/047* (2013.01); *H03H 9/02157* (2013.01)

(58) Field of Classification Search
    CPC ............ H03H 3/04; H03H 9/21; H03H 9/215; H03H 2003/026; H03H 2003/0492;
    (Continued)

(56) References Cited

U.S. PATENT DOCUMENTS 9,534,894 B2 *   1/2017  Ichikawa ........... G01C 19/5607
2002/0121941 A1  9/2002  Sakata et al.
(Continued)

FOREIGN PATENT DOCUMENTS

JP   2002-261576 A   9/2002
JP   2003-060482 A   2/2003
(Continued)

OTHER PUBLICATIONS

International Search Report issued for PCT/JP2013/081625, dated Dec. 24, 2013.

*Primary Examiner* — J. San Martin
(74) *Attorney, Agent, or Firm* — Arent Fox LLP (57) ABSTRACT

A tuning-fork type quartz vibrator is disclosed that includes excitation electrodes and a tuning-fork type vibrating reed that is made of quartz and in which first and second vibrating arm sections are integrally joined to a base section. In each of the first and second vibrating sections, a plurality of through-holes and two or more crosspieces are provided. Further, an effective excitation electrode ratio is no more than 0.97, the effective excitation electrode ratio being expressed by (a total area of the excitation electrodes in a cross-section orthogonal to a second direction as a width direction of each of the first and second vibrating arm sections)/(an area of a region where the plurality of through-holes are provided in the cross-section orthogonal to the second direction as the width direction of each of the first and second vibrating arm sections).

14 Claims, 8 Drawing Sheets

(58) Field of Classification Search
CPC .. H03H 9/2468; H03H 9/2473; H03H 9/2484; H03H 9/2494; B06B 1/0659; G01C 19/5607
USPC .......................................................... 310/370
See application file for complete search history.

(56) References Cited

U.S. PATENT DOCUMENTS

| | | | | |
|---|---|---|---|---|
| 2009/0158566 | A1* | 6/2009 | Hagelin | H03H 3/0073 |
| | | | | 29/25.35 |
| 2010/0207495 | A1* | 8/2010 | Kikushima | H03H 3/02 |
| | | | | 310/370 |
| 2012/0137775 | A1* | 6/2012 | Yamada | H03H 9/21 |
| | | | | 73/504.16 |
| 2014/0055206 | A1* | 2/2014 | Yamada | G06F 1/1616 |
| | | | | 331/156 |

FOREIGN PATENT DOCUMENTS

| | | | | | |
|---|---|---|---|---|---|
| JP | 2003060482 | A | * | 2/2003 | |
| JP | 2003-133896 | A | | 5/2003 | |
| JP | 2004-350015 | A | | 12/2004 | |
| JP | 2006-270335 | A | | 10/2006 | |
| JP | 2006270335 | A | * | 10/2006 | |
| JP | 2009-165164 | A | | 7/2009 | |
| JP | 2009-201162 | A | | 9/2009 | |
| JP | 2010-193133 | A | | 9/2010 | |
| JP | 2010-193444 | A | | 9/2010 | |
| JP | 2014150422 | A | * | 8/2014 | |
| WO | WO 0044092 | A1 | | 7/2000 | |
| WO | WO 2014002892 | A1 | * | 1/2014 | ............. H03H 9/215 |

* cited by examiner

TUNING-FORK TYPE QUARTZ VIBRATOR

CROSS-REFERENCE TO RELATED APPLICATIONS

The present application is a continuation of PCT/JP2013/081625 filed Nov. 25, 2013, which claims priority to Japanese Patent Application No. 2013-014725, filed Jan. 29, 2013, the entire contents of each of which are incorporated herein by reference.

FIELD OF THE INVENTION

The present invention relates to tuning-fork type quartz vibrators having a plurality of vibrating arm sections, and specifically relates to tuning-fork type quartz vibrators in which a plurality of through-holes are provided in the vibrating arm sections.

BACKGROUND OF THE INVENTION

Tuning-fork type quartz vibrators have been used for oscillators and so on. Patent Document 1 cited below discloses a tuning-fork type quartz vibrator 1001 as illustrated in a plan view in FIG. 12.

Figure 12:
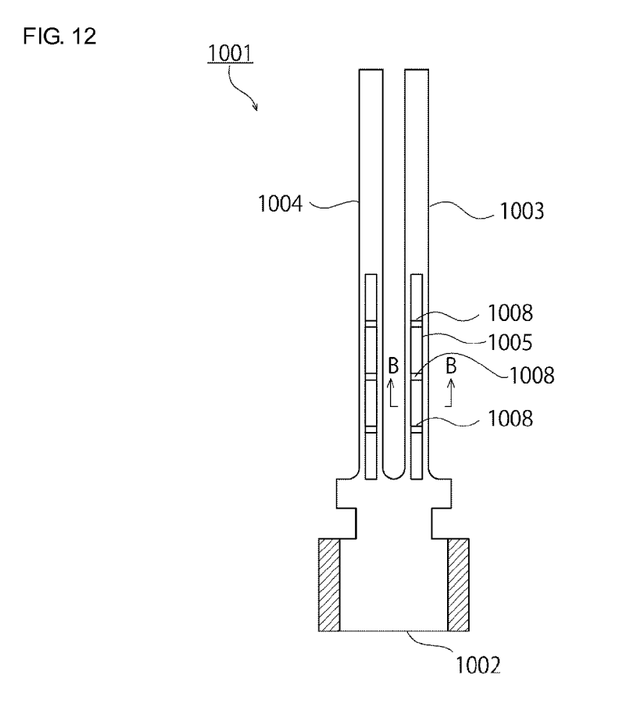
FIG. 12 is a plan view of an existing tuning-fork type quartz vibrator.

The tuning-fork type quartz vibrator 1001 includes a base section 1002 and vibrating arm sections 1003, 1004; first end portions of the vibrating arm sections 1003, 1004 are respectively connected to the base section 1002. The base section 1002 and the vibrating arm sections 1003, 1004 are formed through processing a quartz substrate. A plurality of through-holes 1005 are provided in the vibrating arm section 1003 extending in a lengthwise direction thereof.

Figure 13:
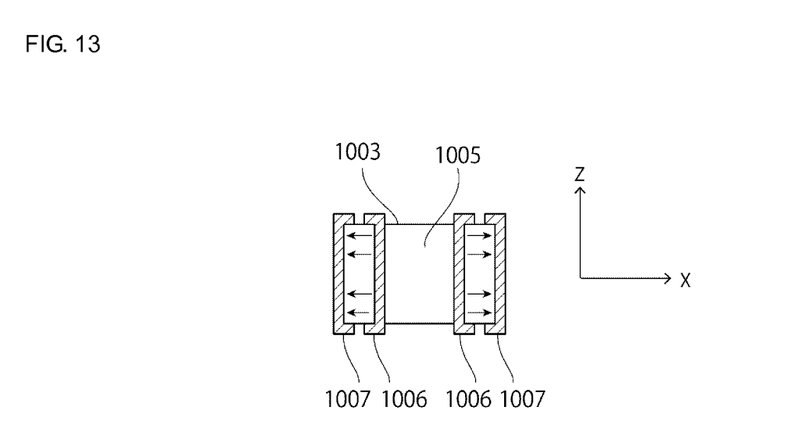
FIG. 13 is a cross-sectional view taken along a B-B line in FIG. 12.

FIG. 13 is a cross-sectional view taken along a B-B line in FIG. 12. Directions of the electric fields applied to vibrating arm segments on both sides of the through-hole 1005 in the vibrating arm section 1003 are indicated by arrow marks in the drawing, while having a relationship with crystal axes of the quartz substrate as shown in FIG. 13. Further, a first vibration electrode 1006 is provided on each side surface facing the through-hole 1005 and a second vibration electrode 1007 is provided on a side surface of each outer side portion in the vibrating arm segment. Applying alternating electric fields from the first and second vibration electrodes 1006, 1007 causes the vibrating arm segments on both the sides of the through-hole 1005 to expand and contract in an opposite phase to each other in the vibrating arm section 1003. As such, the vibrating arm section 1003 vibrates in a bending mode. The same can be applied to the vibrating arm section 1004.

In the tuning-fork type quartz vibrator 1001 disclosed in Patent Document 1, there are provided a plurality of side bars 1008 in a region where the through-holes 1005 are provided.

Patent Document 1: Japanese Patent No. 3900513.

In the tuning-fork type quartz vibrator 1001, the vibrating arm segments on both the sides of the through-hole 1005 expand and contract in opposite phase to each other in the vibrating arm sections 1003 and 1004, and the vibrating arm sections 1003 and 1004 each vibrate in a bending mode. In the vibrating arm sections 1003 and 1004, providing the side bars 1008 increases the transmissibility of stress of expansion and contraction between the vibrating arm segments on both the sides of the through-hole 1005. In addition, mechanical strength is enhanced by the side bars 1008.

However, in the above tuning-fork type quartz vibrator 1001, a vibration form of the bending mode is deformed in some case even if the side bars 1008 are provided. Because of this, there are cases in which favorable vibration characteristics cannot be obtained.

SUMMARY OF THE INVENTION

An object of the present invention is to provide tuning-fork type quartz vibrators which make it possible to obtain more favorable vibration characteristics.

A tuning-fork type quartz vibrator according to the present invention includes a tuning-fork type vibrating reed and excitation electrodes. The tuning-fork type vibrating reed is made of quartz. This tuning-fork type vibrating reed includes a base section and a plurality of vibrating arm sections integrally joined to the base section. Each vibrating arm section includes a first end portion which is integrally joined to the base section, a second end portion which is positioned on a side opposite to the first end portion, and first and second principal surfaces opposing each other in a thickness direction. The excitation electrodes are provided in the vibrating arm sections.

A lengthwise direction in which the first end portion and the second end portion are connected in the vibrating arm section is taken as a first direction, a width direction of the vibrating arm section orthogonal to the first direction is taken as a second direction, and the thickness direction of the vibrating arm section orthogonal to the first and second directions is taken as a third direction.

In the present invention, there are provided, in the vibrating arm section, a plurality of through-holes arranged along the first direction and penetrating through the vibrating arm section in the third direction, and crosspieces each extending in the second direction and defining adjacent through-holes. Each through-hole has first and second inner side surfaces opposing each other in the first direction and third and fourth inner side surfaces opposing each other in the second direction. The excitation electrodes are provided on the third and fourth inner side surfaces of the through-hole as well as vibrating arm section outer-surfaces opposing the third and fourth inner side surfaces.

In the present invention, the number of the crosspieces is no less than two. Further, an effective excitation electrode ratio is no more than 0.97, the effective excitation electrode ratio being expressed by (a total area of the excitation electrodes in a cross-section orthogonal to the second direction of the vibrating arm section)/(an area of a region where the plurality of through-holes are provided in the cross-section orthogonal to the second direction of the vibrating arm section).

In a specific aspect of the tuning-fork type quartz vibrator according to the present invention, in a cross-section of the vibrating arm section orthogonal to the second direction, an angle formed by a side surface of the crosspiece configuring the first or second inner side surface of the through-hole and the first or second principal surface of the vibrating arm section is an acute angle.

In another specific aspect of the tuning-fork type quartz vibrator according to the present invention, in a cross-section of the vibrating arm section orthogonal to the first direction, an angle formed by the third or fourth inner side surface of the through-hole and the first or second principal surface of the vibrating arm section is an acute angle.

In still another aspect of the tuning-fork type quartz vibrator according to the present invention, the plurality of through-holes are provided being shifted toward the first end portion side in the vibrating arm section.

In further another aspect of the tuning-fork type quartz vibrator according to the present invention, the tuning-fork type quartz vibrator further includes a weight whose dimension along the second direction is larger than a dimension of the vibrating arm section along the second direction, and which is integrally jointed to the second end portion of the vibrating arm section. Note that the weight may have a through-hole or a recess.

In the tuning-fork type quartz vibrator according to the present invention, because the effective excitation electrode ratio is no more than 0.97, it is possible to suppress the vibration form of the bending mode from being deformed. This makes it possible to obtain more favorable vibration characteristics with certainty.

DETAILED DESCRIPTION OF THE EXEMPLARY EMBODIMENTS

Hereinafter, specific embodiments of the present invention will be described with reference to the drawings so as to clarify the present invention.

Figure 1A:
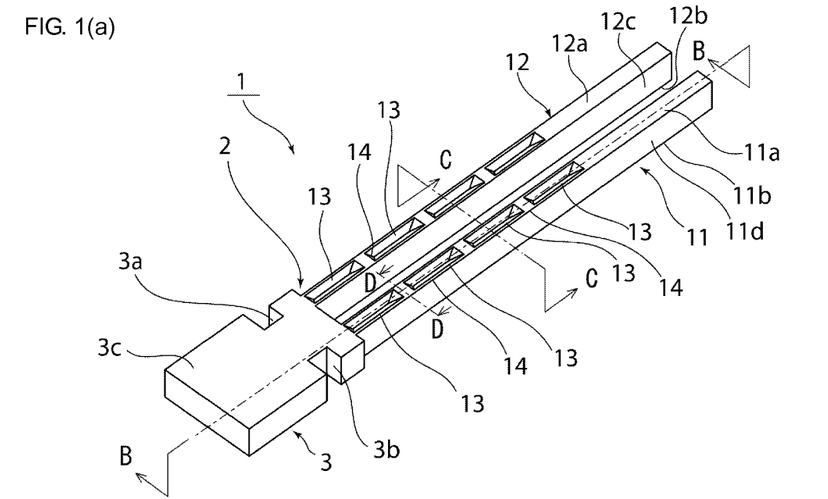
FIG. 1(a) is a schematic perspective view of a tuning-fork type quartz vibrator according to a first embodiment of the present invention.

FIG. 1(a) is a schematic perspective view illustrating a tuning-fork type quartz vibrator according to a first embodiment of the present invention.

A tuning-fork type quartz vibrator 1 according to the first embodiment of the present invention includes a tuning-fork type vibrating reed 2 and excitation electrodes. The excitation electrodes are not illustrated in FIG. 1(a). That is, in FIG. 1(a), the tuning-fork type vibrating reed 2 of the tuning-fork type quartz vibrator 1 is illustrated in the perspective view.

The tuning-fork type vibrating reed 2 is made of quartz. A Z-cut quartz is used in the present embodiment. The tuning-fork type vibrating reed 2 includes a base section 3. The base section 3 is a section for connecting the tuning-fork type quartz vibrator 1 to the exterior. First and second vibrating arm sections 11 and 12 are integrally joined to the base section 3.

The first and second vibrating arm sections 11 and 12 each include a first end portion which is integrally jointed to the base section 3 and a second end portion which is another end portion positioned on a side opposite to the first end portion. A lengthwise direction in which the first end portion and the second end portion of each of the first and second vibrating arm sections 11 and 12 are connected is taken as a first direction. A width direction of each of the first and second vibrating arm sections 11 and 12 which is orthogonal to the first direction is taken as a second direction. Further, a thickness direction of each of the first and second vibrating arm sections 11 and 12 which is orthogonal to the first and second directions is taken as a third direction. Note that the first direction corresponds to a Y-axis direction of the quartz configuring the tuning-fork type vibrating reed 2. The second direction corresponds to an X-axis direction of the quartz configuring the tuning-fork type vibrating reed 2. The third direction corresponds to a Z-axis direction of the quartz configuring the tuning-fork type vibrating reed 2.

The first vibrating arm section 11 has a first principal surface 11a and a second principal surface 11b opposing each other in the third direction. The second vibrating arm section 12 has a first principal surface 12a and a second principal surface 12b opposing each other in the third direction.

Further, there are provided cutouts 3a and 3b in the base section 3 on both sides thereof in the second direction, respectively. Accordingly, even if a segment 3c which is positioned on an opposite side to the first and second vibrating arm sections 11 and 12 relative to the cutouts 3a and 3b is mechanically constrained, vibrations of the first and second vibrating arm sections 11 and 12 are unlikely to be suppressed. Note that, however, it is not absolutely necessary for the cutouts 3a and 3b to be provided.

Figure 1B:
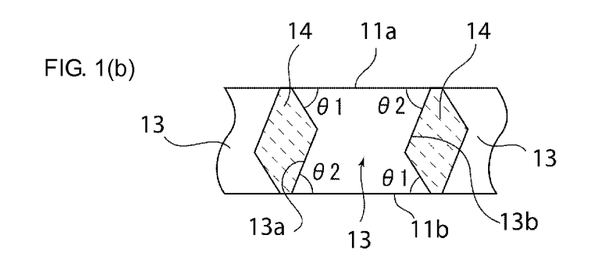
FIG. 1(b) is a schematic cross-sectional view illustrating part of a cross-section of a first vibrating arm section taken along a B-B line in FIG. 1(a).

In each of the first and second vibrating arm sections 11 and 12, a plurality of through-holes 13 are provided. The plurality of through-holes 13 are arranged along the first direction while penetrating through each of the first and second vibrating arm sections 11 and 12 in the third direction. Adjacent through-holes 13 and 13 in the first direction are defined by a crosspiece 14. FIG. 1(b) shows a cross-section of the first vibrating arm section 11 when viewed along a B-B line in FIG. 1(a), in other words, FIG. 1(b) is a schematic cross-sectional view illustrating part of the cross-section which is orthogonal to the second direction. The adjacent through-holes 13 and 13 in the first direction are defined by the crosspiece 14.

Two or more crosspieces 14 are provided in each of the first and second vibrating arm sections 11 and 12. Accordingly, three or more through-holes 13 are provided.

Figure 1C:
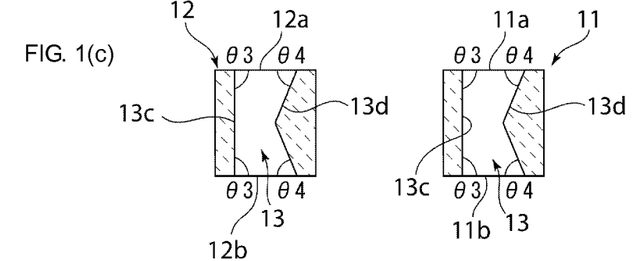
FIG. 1(c) is a schematic cross-sectional view of a tuning-fork type vibrating reed taken along a C-C line in FIG. 1(a).
Figure 1D:
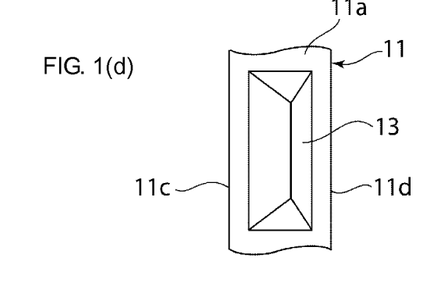
FIG. 1(d) is a schematic plan view illustrating a portion of the first vibrating arm section where a through-hole is provided.
Figure 1E:
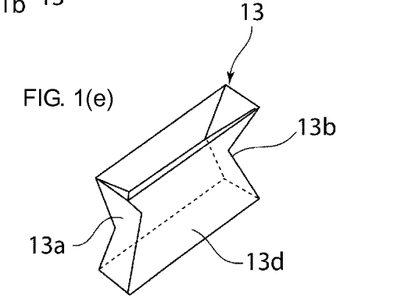
FIG. 1(e) is a general perspective view illustrating a three-dimensional shape of a through-hole.

FIG. 1(c) shows a cross-section of the tuning-fork type vibrating reed 2 when viewed along a C-C line in FIG. 1(a), in other words, FIG. 1(c) is a schematic cross-sectional view illustrating the cross-section orthogonal to the first direction. Note that the excitation electrodes are not illustrated in FIG. 1(c). FIG. 1(d) is a schematic plan view illustrating a portion of the first vibrating arm section 11 where the through-hole 13 is provided. FIG. 1(e) is a general perspective view illustrating a three-dimensional shape of the through-hole 13. As shown in FIGS. 1(b) and 1(c), the through-hole 13 has first and second inner side surfaces 13a, 13b opposing each other in the first direction and third and fourth inner side surfaces 13c, 13d opposing each other in the second direction.

Figure 2A:
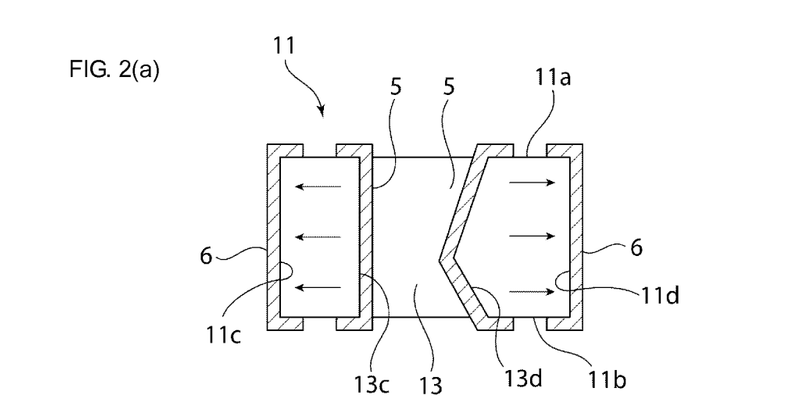
FIG. 2(a) is a schematic cross-sectional view of the first vibrating arm section taken along the C-C line in FIG. 1(a).
Figure 2B:
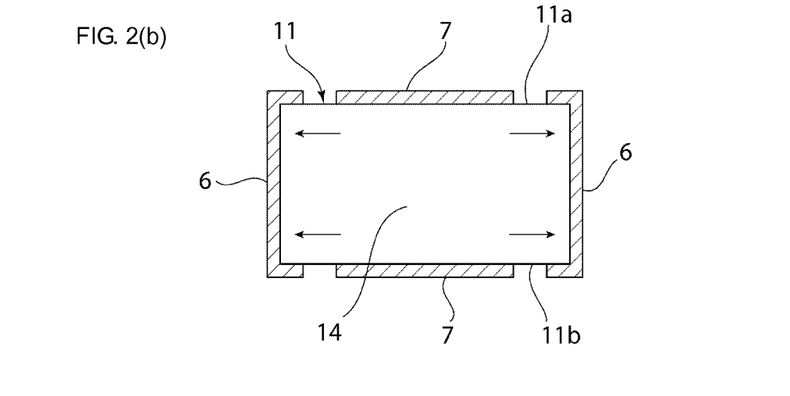
FIG. 2(b) is a schematic cross-sectional view taken along a D-D line in FIG. 1(a).

FIG. 2(a) shows a cross-sectional of the first vibrating arm section 11 when viewed along the C-C line in FIG. 1(a), in other words, FIG. 2(a) is a schematic cross-sectional view illustrating the cross-section orthogonal to the first direction. FIG. 2(b) is a schematic cross-sectional view taken along a D-D line in FIG. 1(a). As shown in FIGS. 2(a) and 2(b), excitation electrodes 5, 6 and connection electrodes 7 are provided in the first vibrating arm section 11. In FIG. 2(a), a state in which the excitation electrodes 5 and 6 are additionally depicted in the first vibrating arm section 11 shown in FIG. 1(c) is shown.

As shown in FIG. 2(a), the excitation electrodes 5 and 5 are provided on the third and fourth inner side surfaces 13c and 13d of the through-hole 13, respectively, in the first vibrating arm section 11. The excitation electrodes 5, 5 and the excitation electrodes 6, 6 are respectively so provided as to extend and reach the first and second principal surfaces 11a and 11b. The excitation electrodes 5 and 5 are electrically connected to the exterior by the portions thereof provided on the first and second principal surfaces 11a and 11b.

As shown in FIG. 2(a), in the first vibrating arm section 11, the excitation electrodes 6 and 6 are respectively provided on vibrating arm section outer-surface segments 11c and 11d opposing the third and fourth inner side surfaces 13c and 13d of the through-hole 13 in the second direction, in other words, provided on the outer-surface segments orthogonal to the second direction at a portion where the through-hole 13 is provided. Further, as shown in FIG. 2(b), the excitation electrodes 6 and 6 are also provided respectively on the outer-surface segments orthogonal to the second direction at a portion where the crosspiece 14 is provided in the first vibrating arm section 11. In other words, the excitation electrodes 6 and 6 are respectively provided on the outer-surface segments orthogonal to the second direction so as to extend across the overall region where the plurality of through-holes 13 of the first vibrating arm section 11 are provided in the first direction, or the lengthwise direction of the first vibrating arm section 11. The excitation electrodes 6 and 6 are respectively so provided as to extend and reach the first and second principal surfaces 11a and 11b.

As shown in FIG. 2(b), the connection electrodes 7 are provided on the first and second principal surfaces 11a and 11b, respectively, at the portion where the crosspiece 14 is provided in the first vibrating arm section 11. The connection electrodes 7 are integrally joined to the excitation electrodes 5 so as to electrically connect the excitation electrodes 5 adjacent to each other in the first direction, or the lengthwise direction of the first vibrating arm section 11.

In the first vibrating arm section 11, electric fields are applied, in the directions indicated by arrow marks in FIG. 2(a), to segments positioned on both sides of the through-hole 13 in the second direction. As such, by applying alternating voltages between the excitation electrodes 5 and excitation electrodes 6, the first vibrating arm section 11 vibrates in a bending mode.

Excitation electrodes and connection electrodes are provided in the second vibrating arm section 12 in the same manner as in the first vibrating arm section 11. In the tuning-fork type quartz vibrator 1 of the present embodiment, the number of the crosspieces 14 is no less than two and the effective excitation electrode ratio is no more than 0.97, which makes it possible to improve the vibration characteristics with certainty. This will be specifically explained hereinafter. As disclosed in Patent Document 1, it has been known that vibration characteristics and mechanical strength of the tuning-fork type quartz vibrator can be improved by providing side bars, that is, crosspieces. However, vibration characteristics cannot be necessarily improved in some case even if the above-mentioned crosspieces are provided.

The inventors of the present invention variously changed the number of the crosspieces in the same configuration as that of the tuning-fork type quartz vibrator 1 of the first embodiment, and vibration characteristics of the tuning-fork type quartz vibrator in various numbers of the crosspieces were evaluated. The result is shown in FIG. 5.

Figure 3:
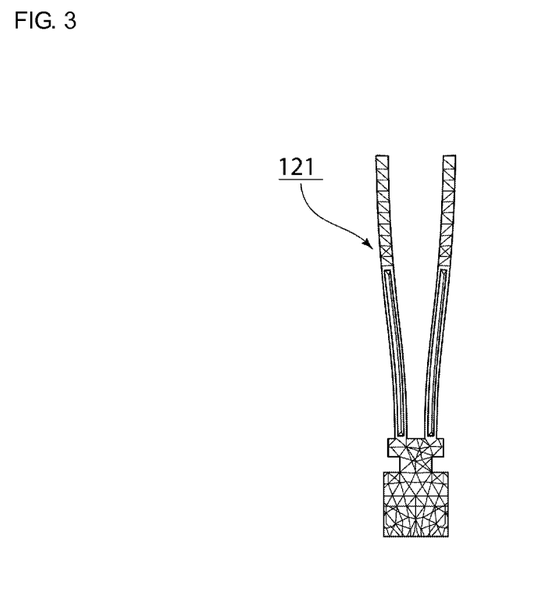
FIG. 3 is a schematic plan view illustrating a vibration form of a tuning-fork type quartz vibrator according to a comparative example when the tuning-fork type quartz vibrator is vibrated in a bending mode.
Figure 4:
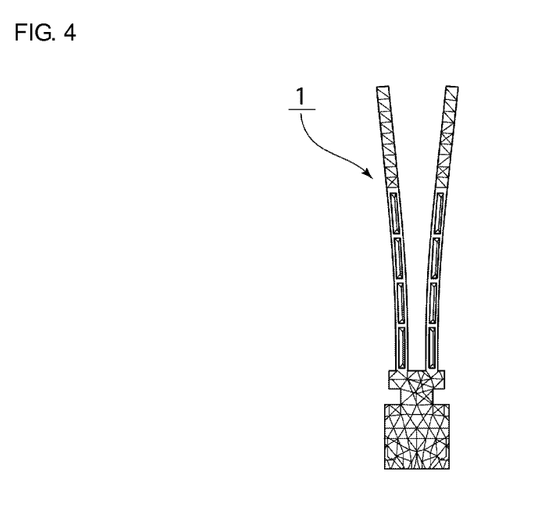
FIG. 4 is a schematic plan view illustrating a vibration form of the tuning-fork type quartz vibrator according to the first embodiment of the present invention when the tuning-fork type quartz vibrator is vibrated in a bending mode.

FIG. 3 is a schematic plan view illustrating a vibration form of a tuning-fork type quartz vibrator according to a comparative example, in which the number of the crosspieces is 0 when the tuning-form type quartz vibrator being vibrated in a bending mode. FIG. 4 is a schematic plan view illustrating a vibration form of the tuning-fork type quartz vibrator 1 of the first embodiment, in which the number of the crosspieces is three when the tuning-fork type quartz vibrator 1 being vibrated in a bending mode. As shown in FIGS. 3 and 4, the tuning-fork type quartz vibrator 1 of the first embodiment vibrates more favorably in the bending more than the tuning-fork type quartz vibrator according to the comparative example.

Figure 5:
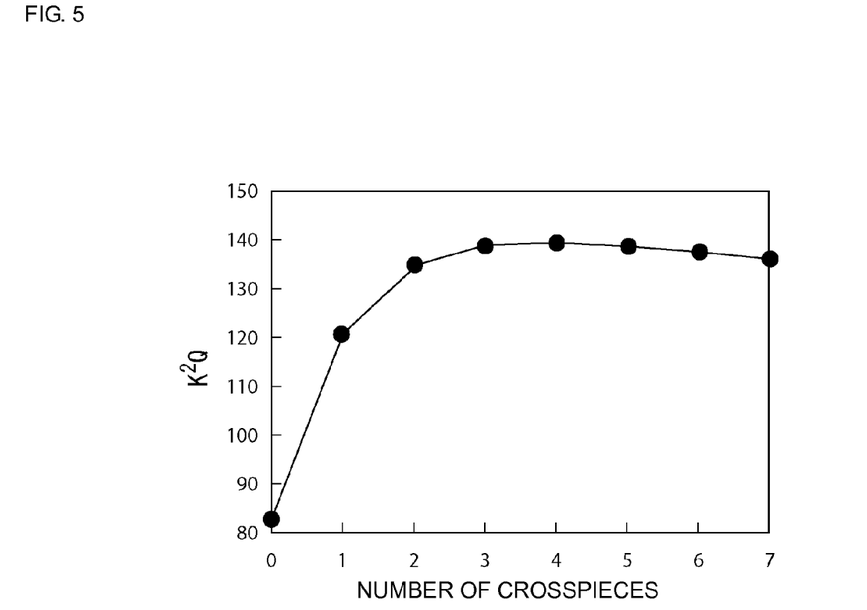
FIG. 5 is a diagram illustrating a relationship between the number of crosspieces and $k^2Q$ representing vibration characteristics.

Further, as shown in FIG. 5, in the case where the number of the crosspieces is no more than one, $k^2Q$ representing the vibration characteristics is small; however, in the case where the number of the crosspieces is no less than two, it is understood that $k^2Q$ becomes larger and the vibration characteristics can be improved. In FIG. 5, in the case where the number of the crosspieces is three, $k^2Q$ is close to a value of 137.

However, it was also found that the vibration characteristics were not favorable in some case even if the number of the crosspieces was no less than two.

Figure 6:
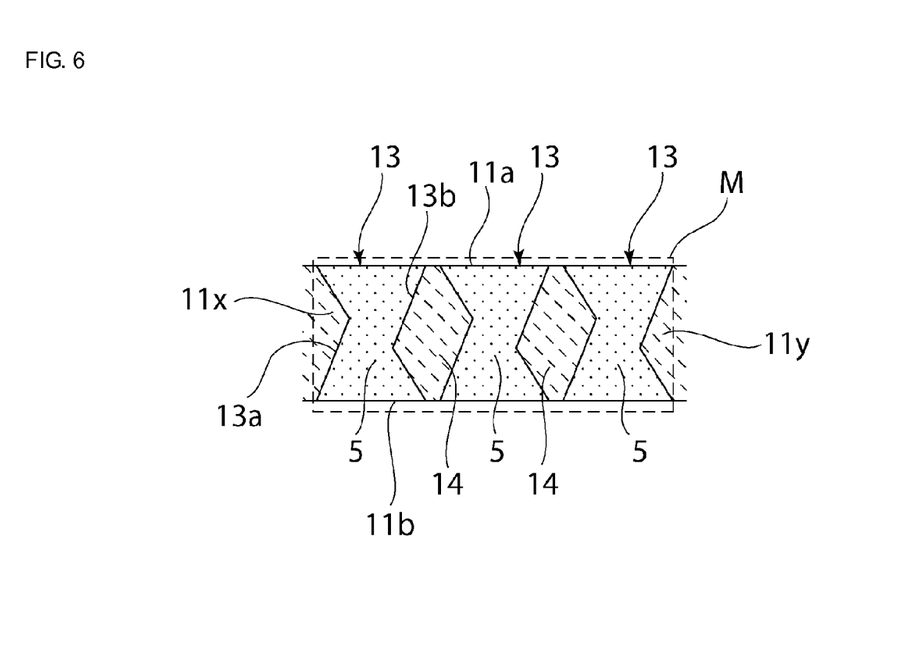
FIG. 6 is a schematic diagram for explaining an effective excitation electrode ratio.

As such, the inventors carried out the research more deeply and then evaluated the vibration characteristics of the tuning-fork type quartz vibrator 1 while changing the effective excitation electrode ratio in various values. Here, the effective excitation electrode ratio is expressed by (a total area of the excitation electrodes in a cross-section orthogonal to the second direction of the vibrating arm section)/(an area of a region where the plurality of through-holes are provided in the cross-section orthogonal to the second direction of the vibrating arm section). This will be explained referring to FIG. 6. Like FIG. 1(b), FIG. 6 shows a cross-section of the first vibrating arm section 11 when viewed along the B-B line in FIG. 1(a), in other words, FIG. 6 is a schematic cross-sectional view illustrating part of the cross-section which is orthogonal to the second direction. Here, a case in which the number of the crosspieces is two and the number of the through-holes 13 is three is exemplified. In this case, as shown in FIG. 6, a total area of the excitation electrodes in a cross-section orthogonal to the second direction of the first vibrating arm section 11 is the sum of the areas of three through-holes 13, 13, and 13. In other words, the sum of the areas of the excitation electrodes 5, 5, and 5 positioned on the respective first inner side surfaces 13a of the three through-holes 13, 13, and 13 corresponds to the total area of the excitation electrodes.

Meanwhile, an area of a region where the plurality of through-holes 13 are provided in the cross-section orthogonal to the second direction of the first vibrating arm section 11 corresponds to an area of a region enclosed by a broken line M in FIG. 6. In this enclosed region, all of the through-holes 13, 13, and 13 are provided; and in the area of this region, respective areas of the crosspieces 14 and 14 that are included in the region are also added. In other words, in the region where the plurality of through-holes 13 are arranged along the first direction of the vibrating arm section, a product of a thickness direction dimension of the vibrating arm section and a line segment connecting an end portion on one end side of the first direction and an end portion on the other side along the first direction corresponds to the area of the region where the plurality of through-holes 13 are provided in the cross-section orthogonal to the second direction of the vibrating arm section.

In the present invention, as explained later, the first and second inner side surfaces 13a and 13b of the through-hole 13 are not flat. As such, the area M also includes areas of vibrating arm segments 11x and 11y respectively positioned on outer side portions in the first direction of the region where the plurality of through-holes 13 are provided. Note that, however, the vibrating arm segments 11x and 11y are not included therein in the case where the first and second inner side surfaces 13a and 13b of the through-hole 13 are surfaces linearly extending in the third direction.

Figure 7:
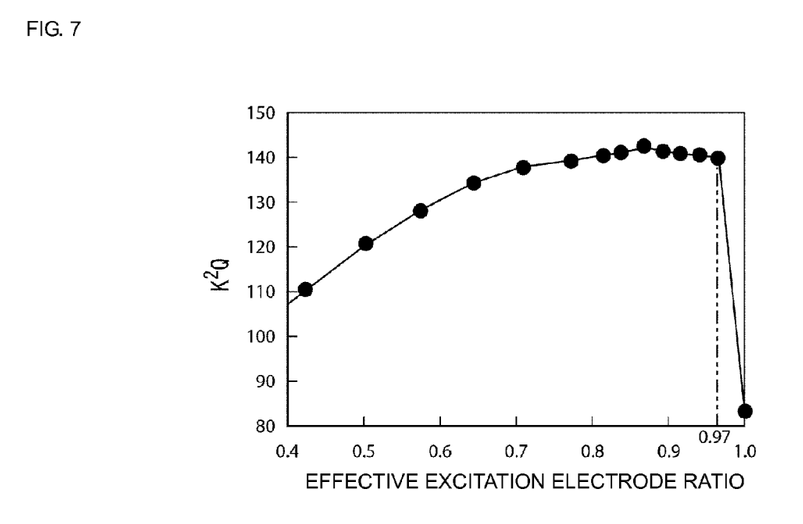
FIG. 7 is a diagram illustrating a relationship between an effective excitation electrode ratio and $k^2Q$ representing vibration characteristics.

The tuning-fork type quartz vibrator 1 with the effective excitation electrode ratio being changed in various different values was manufactured and the vibration characteristics thereof were evaluated. The result is shown in FIG. 7. Note that in the present embodiment, angles of θ1-θ4 shown in FIGS. 1(b) and 1(c) were set as follows. That is, θ1=50 degrees, θ2=70 degrees, θ3=89 degrees, and θ4=70 degrees.

θ1 is an angle that is formed, in a cross-section orthogonal to the second direction of the first vibrating arm section 11 or second vibrating arm section 12, by a side surface of the crosspiece 14 configuring the first inner side surface 13a of the through-hole 13 and the first principal surface 11a or 12a of the first vibrating arm section 11 or second vibrating arm section 12; and is also an angle that is formed by a side surface of the crosspiece 14 configuring the second inner side surface 13b of the through-hole 13 and the second principal surface 11b or 12b of the first vibrating arm section 11 or second vibrating arm section 12.

θ2 is an angle that is formed, in the cross-section orthogonal to the second direction of the first vibrating arm section 11 or second vibrating arm section 12, by the side surface of the crosspiece 14 configuring the first inner side surface 13a of the through-hole 13 and the second principal surface 11b or 12a of the first vibrating arm section 11 or second vibrating arm section 12; and is also an angle that is formed by the side surface of the crosspiece 14 configuring the second inner side surface 13b of the through-hole 13 and the first principal surface 11a or 12a of the first vibrating arm section 11 or second vibrating arm section 12.

θ3 is an angle that is formed, in a cross-section orthogonal to the first direction of the first vibrating arm section 11 or second vibrating arm section 12, by the third inner side surface 13c of the through-hole 13 and the first principal surface 11a or 12a of the first vibrating arm section 11 or second vibrating arm section 12; and is also an angle that is formed by the third inner side surface 13c of the through-hole 13 and the second principal surface 11b or 12b of the first vibrating arm section 11 or second vibrating arm section 12.

θ4 is an angle that is formed, in the cross-section orthogonal to the first direction of the first vibrating arm section 11 or second vibrating arm section 12, by the fourth inner side surface 13d of the through-hole 13 and the first principal surface 11a or 12a of the first vibrating arm section 11 or second vibrating arm section 12; and is also an angle that is formed by the fourth inner side surface 13d of the through-hole 13 and the second principal surface 11b or 12b of the first vibrating arm section 11 or second vibrating arm section 12.

As is clear from FIG. 7, it is understood that $k^2Q$ representing the vibration characteristics rapidly drops in the case where the effective excitation electrode ratio goes beyond 0.97.

Accordingly, as is also clear from FIG. 7, it is understood that favorable vibration characteristics can be obtained with certainty in the case where the effective excitation electrode ratio is no more than 0.97.

The effective excitation electrode ratio represents a proportion of the area occupied by the excitation electrodes in the overall region where the plurality of through-holes are provided in a cross-section orthogonal to the second direction of the vibrating arm section. As such, it can be considered that the vibration characteristics are improved as the proportion of the area of the excitation electrodes is larger, in other words, the effective excitation electrode ratio is higher. However, as described above, in the case where the effective excitation electrode ratio was beyond 0.97, the vibration characteristics were significantly deteriorated.

Accordingly, in the present invention, the effective excitation electrode ratio is so set as to be no more than 0.97, thereby making it possible to obtain favorable vibration characteristics with certainty.

Next, θ1-θ4 shown in FIGS. 1(b) and 1(c) will be described.

In the present invention, θ1, θ2, θ3, and θ4 are acute angles, in other words, angles less than 90 degrees. This makes it easy to form the through-holes 13 by wet etching. In the formation of the through-holes 13 by wet etching, the etching from the side of the first principal surfaces 11a and 12a of the first and second vibrating arm sections 11 and 12 and the etching from the side of the second principal surfaces 11b and 12b thereof are carried out at the same time. In this case, the etching progresses both from the side of the first and second principal surfaces 11a and 12a and from the side of the second principal surfaces 11b and 12b. As such, the through-holes 13 in which at least one of θ1-θ4 is an acute angle can be easily formed.

Note that in the present embodiment, θ3 is 90 degrees and is not an acute angle. However in the present invention, θ3 may be also an acute angle. That is, in the case where at least one of θ1, θ2 and at least one of θ3, θ4 are acute angles, the through-holes can be easily formed by wet etching. Note that, however, it is not absolutely necessary for θ1-θ4 to be formed as acute angles in the present invention.

Further, in the tuning-fork type quartz vibrator 1 of the present embodiment, the plurality of through-holes 13 are provided being shifted toward the side of the first end portion integrally joined to the base section 3 in each of the first and second vibrating arm sections 11 and 12. This makes it possible to further improve the vibration characteristics.

Figure 9:
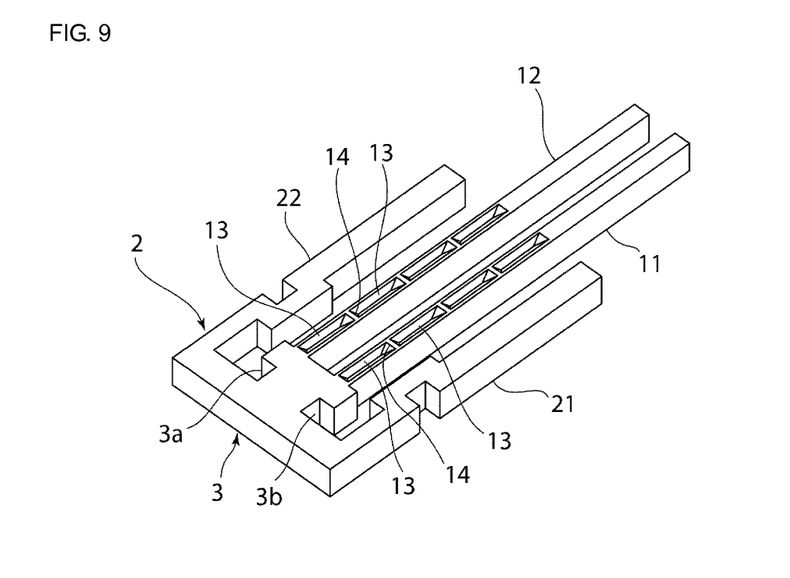
FIG. 9 is a general perspective view of a tuning-fork type quartz vibrator according to a second embodiment of the present invention.

FIG. 9 is a general perspective view of a tuning-fork type quartz vibrator according to a second embodiment of the present invention. The tuning-fork type quartz vibrator according to the present embodiment includes support arms 21 and 22 in addition to the constituent elements of the tuning-fork type quartz vibrator 1 according to the first embodiment. To be more specific, in the tuning-fork type quartz vibrator according to the present embodiment, at a portion of the tuning-fork type vibrating reed 2 where the first and second vibrating arm sections 11 and 12 are provided, support arms 21 and 22 are additionally provided on width-direction outer sides of the first and second vibrating arm sections 11 and 12, respectively, extending in parallel to the first and second vibrating arm sections 11 and 12. By providing the support arms 21 and 22, vibration energy of the first and second vibrating arm sections 11 and 12 can be effectively confined. This makes it possible to reduce loss due to the support structure. As such, the vibration characteristics can be further improved.

Figure 10:
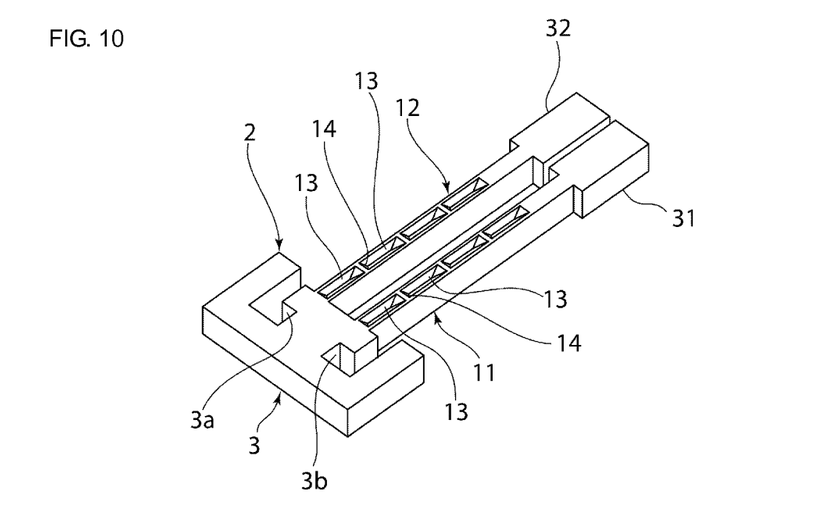
FIG. 10 is a general perspective view of a tuning-fork type quartz vibrator according to a third embodiment of the present invention.

FIG. 10 is a general perspective view of a tuning-fork type quartz vibrator according to a third embodiment of the present invention. The tuning-fork type quartz vibrator according to the present embodiment includes weights 31 and 32 in addition to the constituent elements of the tuning-fork type quartz vibrator 1 according to the first embodiment. To be more specific, in the present embodiment, the weights 31 and 32 are integrally joined to leading ends, in other words, the second end portion sides of the first and second vibrating arm sections 11 and 12, respectively, in the tuning-fork type vibrating reed 2.

A width direction of the weights 31 and 32 is the same as that of the first and second vibrating arm sections 11 and 12, and a width direction dimension of each of the weights 31 and 32 is longer than that of each of the first and second vibrating sections 11 and 12. It is preferable for the weights 31 and 32 to be made of the aforementioned quartz and formed integrally along with the first and second vibrating arm sections 11 and 12; however, the invention is not intended to be limited thereto. By providing the weights 31 and 32, the resonant frequency can be lowered. This makes it possible to miniaturize the tuning-fork type quartz vibrator.

Figure 11:
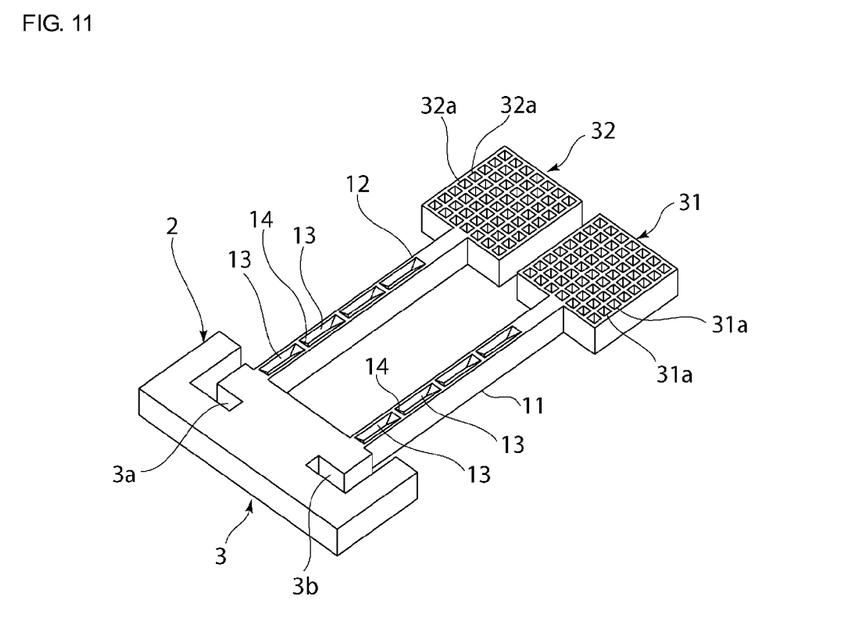
FIG. 11 is a general perspective view of a tuning-fork type quartz vibrator according to a fourth embodiment of the present invention.

FIG. 11 is a general perspective view of a tuning-fork type quartz vibrator according to a fourth embodiment of the present invention. In the tuning-fork type quartz vibrator according to the present embodiment, there are provided a plurality of through-holes 31*a* and a plurality of through-holes 32*a* in the weights 31 and 32, respectively, in addition to the constituent elements of the tuning-fork type quartz vibrator according to the third embodiment. Providing the through-holes 31*a* and 32*a* makes it possible to suppress a change in resonant frequency due to processing variation in etching.

Figure 8:
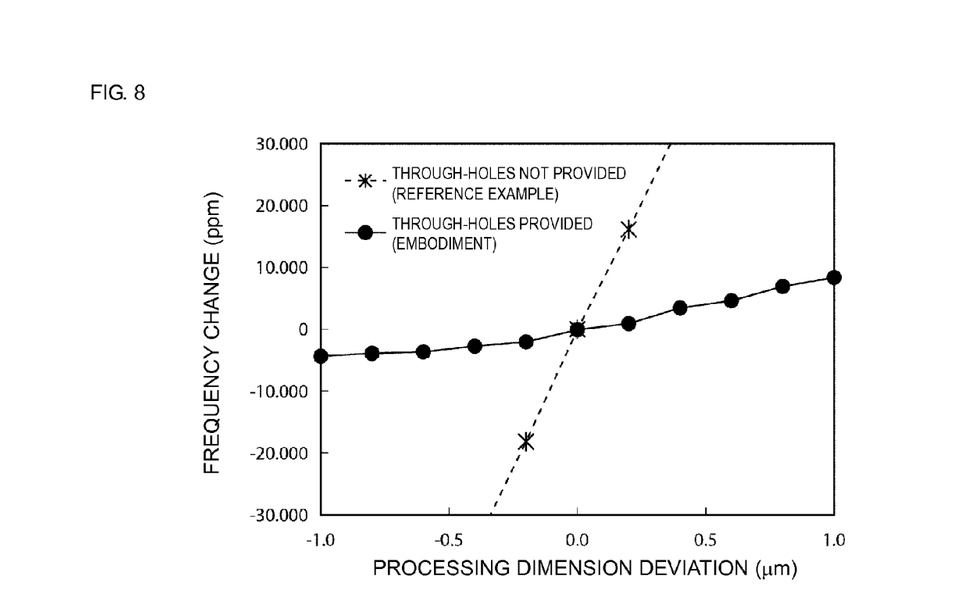
FIG. 8 is a diagram illustrating a relationship between processing dimension deviation in etching and an amount of change in resonant frequency in an embodiment including a weight in which through-holes are provided, and a relationship between the processing dimension deviation in etching and the amount of change in resonant frequency in a reference example including a weight in which through-holes are not provided.

FIG. 8 is a diagram illustrating a relationship between processing dimension deviation in etching and an amount of change in resonant frequency in the present embodiment in which the through-holes 31*a*, 32*a* are provided in the weights 31, 32 and a relationship between the processing dimension deviation in etching and the amount of change in resonant frequency in a reference example in which through-holes are not provided in the weights. Here, the processing dimension deviation on the horizontal axis refers to an amount of deviation from the target dimension. As shown in FIG. 8, in the reference example in which through-holes are not provided in the weights, it is observed that the resonant frequency significantly changes as the processing dimension deviation in etching becomes larger.

On the other hand, according to the present embodiment, as shown in FIG. 8, even in the case where the processing dimension deviation in etching changes, the change in resonant frequency can be suppressed. The reason for this is as follows: that is, in the case where the amount of etching is excessively large, the width direction dimension of each of the first and second vibrating arm sections 11 and 12 becomes small. This causes the resonant frequency to be lowered. In this case, the dimensions of the through-holes 31*a* and 32*a* provided in the weights 31 and 32 become large so that a mass-addition effect by the weights 31 and 32 becomes smaller. This causes the resonant frequency to become higher. Accordingly, the change in resonant frequency can be suppressed. Conversely, in the case where the amount of etching is small, a phenomenon reverse to the above-described phenomenon occurs. In this case, the change in resonant frequency can be also suppressed.

In other words, the change in the resonant frequency due to increase/decrease in the amount of processing can be suppressed by providing the through-holes 31*a* and 32*a*. As discussed above, a changing trend of the resonant frequency based on the change in dimension in the width direction of the first and second vibrating arm sections 11 and 12 in accordance with the change in the amount of etching is opposite to a changing trend of the resonant frequency by the mass-addition effect based on the weights 31 and 32 in accordance with the change in the amount of etching. As such, it is possible to suppress the change in the resonant frequency caused by the deviation of the outer shape dimensions due to the variation in the amount of etching, in other words, the processing variation.

Although, in the present embodiment, the through-holes 31*a* and 32*a* are provided in the weights 31 and 32, respectively, recesses may be provided in place of the through-holes 31*a* and 32*a* in upper surfaces and/or lower surfaces of the weights 31 and 32.

REFERENCE SIGNS LIST

1 TUNING-FORK TYPE QUARTZ VIBRATOR
2 TUNING-FORK TYPE VIBRATING REED
3 BASE SECTION
3*a*, 3*b* CUTOUT
3*c* SEGMENT
5, 6 EXCITATION ELECTRODE
7 CONNECTION ELECTRODE
11 FIRST VIBRATING ARM SECTION
12 SECOND VIBRATING ARM SECTION
11*a*, 12*a* FIRST PRINCIPAL SURFACE
11*b*, 12*b* SECOND PRINCIPAL SURFACE
11*c*, 11*d* VIBRATING ARM SECTION OUTER-SURFACE SEGMENT
11*x*, 11*y* VIBRATING ARM SEGMENT
13 THROUGH-HOLE 13a-13d FIRST INNER SIDE SURFACE-FOURTH INNER SIDE SURFACE
14 CROSSPIECE
21, 22 SUPPORT ARM
31, 32 WEIGHT
31a, 32a THROUGH-HOLE

The invention claimed is:

1. A tuning-fork type quartz vibrator comprising:
a quartz vibrating reed having a base and a plurality of vibrating arms each including a first end coupled to the base, a second end opposite to the first end, and first and second principal surfaces opposing each other in a thickness direction; and
a plurality of excitation electrodes disposed in the plurality of vibrating arms of the quartz vibrating reed,
wherein each of the vibrating arms extend from the first end to the second end in a first direction, each of the vibrating arm have a width extending orthogonally to the first direction in a second direction, and each of the vibrating arms have a thickness that extends from the first principal surface to the second principal surface in a third direction,
wherein each of the vibrating arm includes a plurality of through-holes arranged along the first direction and extending through the respective vibrating arm in the third direction, and a plurality of crosspieces that extend in the second direction and define adjacent through-holes,
wherein each through-hole comprises first and second inner side surfaces that extend in the first direction and that oppose each other; and third and fourth inner side surfaces that extend in the second direction and that oppose each other,
wherein the plurality of excitation electrodes are respectively disposed on the third and fourth inner side surfaces of the each of the through-holes and on outer-surfaces of the vibrating arms that oppose the third and fourth inner side surfaces, and
wherein the tuning-fork type quartz vibrator comprises an effective excitation electrode ratio that is less than or equal to 0.97, wherein the effective excitation electrode ratio is expressed by (a total area of the excitation electrodes in a cross-section orthogonal to the second direction of the vibrating arms)/(an area of a region where the plurality of through-holes are provided in the cross-section orthogonal to the second direction of the vibrating arms).

2. The tuning-fork type quartz vibrator according to claim 1, wherein, in a cross-section of each of the vibrating arms orthogonal to the second direction, an angle formed by a side surface of the crosspiece defining the first or second inner side surface of the through-hole and the first or second principal surface of the vibrating arm section is an acute angle.

3. The tuning-fork type quartz vibrator according to claim 1, wherein, in a cross-section of each of the vibrating arms orthogonal to the first direction, an angle formed by the third or fourth inner side surface of the through-hole and the first or second principal surface of the vibrating arm section is an acute angle.

4. The tuning-fork type quartz vibrator according to claim 1, wherein the plurality of through-holes are arranged to shift toward the first end of each of the vibrating arms, respectively.

5. The tuning-fork type quartz vibrator according to claim 1, further comprising a weight with a surface extending in the second direction that is larger than the width of the vibrating arm extending in the second direction.

6. The tuning-fork type quartz vibrator according to claim 5, wherein the weight is integrally connected to the second end of one of the vibrating arms.

7. The tuning-fork type quartz vibrator according to claim 6, wherein the weight has a through-hole or a recess.

8. The tuning-fork type quartz vibrator according to claim 1, wherein the base of the quartz vibrating reed comprises a pair of cutouts extending inward in the second direction from side surfaces of the quartz vibrating reed.

9. The tuning-fork type quartz vibrator according to claim 1, wherein each through-hole comprises two side surfaces facing each other and extending from the first principal surface, with at least one of the side surfaces extending towards the other of the side surfaces.

10. The tuning-fork type quartz vibrator according to claim 9, wherein, at a point between the first principal surface and the second principal surface, the at least one surface comprises an angle and extends away from the other side surface.

11. The tuning-fork type quartz vibrator according to claim 1, wherein the base of the quartz vibrating reed comprises a pair of support arms that extend in the first direction and are disposed outside the plurality of vibrating arms, respectively, in the second direction.

12. A tuning-fork type quartz vibrator comprising:
a base;
a pair of vibrating arms extending parallel to one another in a first direction from the base, each vibrating arm including:
a width extending in a second direction orthogonal to the first direction,
first and second principal surfaces opposing each other in a thickness direction,
a plurality of through-holes arranged along the first direction and extending in the thickness direction, and
a plurality of crosspieces that extend in the second direction and define adjacent through-holes; and
a plurality of excitation electrodes disposed on the respective inner surfaces of the plurality of through-holes, respective side surfaces of the vibrating arms, and the first and second principal surfaces of the vibrating arms, respectively,
wherein the respective excitation electrodes on the first and second principal surfaces of the vibrating arms each connect the respective excitation electrodes disposed on the inner surfaces of adjacent through-holes,
wherein each through-hole comprises first and second inner side surfaces that extend in the first direction and that oppose each other; and third and fourth inner side surfaces that extend in the second direction and that oppose each other, and
wherein the tuning-fork type quartz vibrator comprises an effective excitation electrode ratio that is less than or equal to 0.97, wherein the effective excitation electrode ratio is expressed by (a total area of the excitation electrodes in a cross-section orthogonal to the second direction of the vibrating arms)/(an area of a region where the plurality of through-holes are provided in the cross-section orthogonal to the second direction of the vibrating arms).

13. The tuning-fork type quartz vibrator according to claim 12, wherein, in a cross-section of each of the vibrating arms orthogonal to the second direction, an angle formed by a side surface of the crosspiece defining the first or second inner side surface of the through-hole and the first or second principal surface of the vibrating arm section is an acute angle.

14. The tuning-fork type quartz vibrator according to claim 12, wherein, in a cross-section of each of the vibrating arms orthogonal to the first direction, an angle formed by the third or fourth inner side surface of the through-hole and the first or second principal surface of the vibrating arm section is an acute angle.

* * * * *